United States Patent
Chen et al.

(10) Patent No.: US 10,409,170 B2
(45) Date of Patent: Sep. 10, 2019

(54) METHOD FOR QUICKLY ESTABLISHING LITHOGRAPHY PROCESS CONDITION BY A PRE-COMPENSATION VALUE

(71) Applicant: Shanghai Huali Microelectronics Corporation, Shanghai (CN)

(72) Inventors: Qiaoli Chen, Shanghai (CN); Zhengkai Yang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/800,043

(22) Filed: Oct. 31, 2017

(65) Prior Publication Data
US 2018/0307143 A1   Oct. 25, 2018

(30) Foreign Application Priority Data
Apr. 25, 2017   (CN) .......................... 2017 1 0276130

(51) Int. Cl.
| G03F 7/20 | (2006.01) |
| G03F 1/26 | (2012.01) |
| G03F 1/36 | (2012.01) |
| G03F 1/50 | (2012.01) |
| G03F 1/42 | (2012.01) |
| G03F 1/30 | (2012.01) |

(52) U.S. Cl.
CPC ............ *G03F 7/70625* (2013.01); *G03F 1/26* (2013.01); *G03F 1/30* (2013.01); *G03F 1/36* (2013.01); *G03F 1/42* (2013.01); *G03F 1/50* (2013.01); *G03F 7/70525* (2013.01); *G03F 7/70558* (2013.01); *G03F 7/70641* (2013.01)

(58) Field of Classification Search
CPC ............ G03F 7/70558; G03F 7/70641; G03F 7/7055; G03F 7/70491; G03F 7/705; G03F 7/70516; G03F 7/70525; G03F 7/70533
See application file for complete search history.

(56) References Cited

U.S. PATENT DOCUMENTS

| 6,546,125 | B1 * | 4/2003 | Su | ........................ | G03F 7/70491 348/87 |
| 8,582,078 | B2 * | 11/2013 | Brunner | ............... | G01N 21/956 355/30 |
| 2008/0221709 | A1 * | 9/2008 | Ishii | ........................ | G03F 7/705 700/30 |

* cited by examiner

Primary Examiner — Michelle M Iacoletti
(74) Attorney, Agent, or Firm — Tianchen LLC

(57) ABSTRACT

The present invention discloses a method for quickly establishing lithography process condition by a pre-compensation value, comprising: firstly determining a reference process condition of masks of which parameters are same, and then determining an optimum process condition of the first mask; thereafter, calculating a ratio of the optimum process condition of the first mask deviating from the reference process condition, wherein if the ratio is equal to or larger than a set threshold, the first mask is inspected, and if the ratio is less than the set threshold, an optimum process condition of the second mask is determined according to the ratio and the reference process condition of the second mask; and by analogy, determining optimum process conditions of the rest masks. The method of the present invention can quickly establish a lithograph process condition, reduce the trial production time for determining the optimum defocus amount and exposure amount.

5 Claims, 2 Drawing Sheets

METHOD FOR QUICKLY ESTABLISHING LITHOGRAPHY PROCESS CONDITION BY A PRE-COMPENSATION VALUE

CROSS-REFERENCE TO RELATED APPLICATION

This application claims the priority benefit of China application Ser. No. 2017102761301, filed Apr. 25, 2017. All disclosure of the China application is incorporated herein by reference.

FIELD OF THE INVENTION

The present invention relates to the field of semiconductor fabrication technology, more particularly to a method for quickly establishing lithography process condition by a pre-compensation value.

BACKGROUND OF THE INVENTION

The lithography process is one of the most important procedures of the integrated circuit manufacturing technology, and mask as an article which is indispensable in lithography has a huge effect on the lithography process. The base material used to fabricate the mask is a photomask substrate. And the masks provided by different mask providers will be made by using different photomask substrates provided by different providers, or by using different batches of the photomask substrates provided by the same provider. The quality of the mask received by the lithography will be different due to the difference in the photomask substrate and the difference in the fabrication process of the mask, thereby resulting in that there is difference between the optimum process conditions of different products.

During the lithography, it is required to set process conditions including a defocus amount and an exposure amount, and when the defocus amount and the exposure amount are within a certain range, the lithography process can provide the desired linewidth and overlay error. The lithography engineer needs to ensure all graphs on the mask with appropriate process conditions. To determine the optimum process condition for each of the masks, it is usually to make a focal distance-energy matrix for each of the masks to find the optimum exposure energy and the focal distance, and perform a process window analysis to finally find the most appropriate defocus amount and exposure range. The focal distance-energy matrix indicates a test pattern in two-dimensional distribution of difference exposure energy and focal distance in one silicon wafer.

As shown in FIG. 1, the different exposure amount setting is adopted in each of different regions in a horizontal direction, and the different defocus amount setting is adopted in each of different regions in a vertical direction, so as to realize to adopt different exposure amount setting and/or different defocus amount setting in each region and to finally form the same image in each region by the lithography and measure the image formed in each region, thereby obtaining CD value of the image formed in different regions on the wafer and the whole data set of the corresponding exposure amount and defocus amount, and finally determining the optimum defocus amount and exposure amount according to the obtained optimum CD value of the image.

In the existing lithography process, it is usually to determine the optimum lithography process condition by making a focal distance-energy matrix for each of the masks in the current layer. This action has such problem that it is required to spend extra time and labor each time when the new process condition is determined. To reduce the time spent in determining the new process condition, the lithography engineer will pre-estimate the energy according to the size error of the linewidth of the mask, however such prediction method can't pre-estimate the focal distance; alternatively, the lithography engineer pre-estimates the process condition only from personal experience, however such pre-estimation has no theoretical supports, therefore there is necessary a certain subjective error.

At present, the demand for the producing new products becomes faster and faster, and one problem to which we face is how to decrease the trial production time for determining the process condition and ensure the accuracy of the process condition when the new products are introduced.

SUMMARY OF THE INVENTION

The technical problem to be solved by the present invention is to provide a method for quickly establishing lithography process condition by a pre-compensation value, the lithograph process condition can decrease the trial production time for determining the optimum defocus amount and exposure amount, fast introduces the new product and improve the production capacity.

To achieve the above objects, the present invention adopts the following technical solution: a method for quickly establishing lithography process condition by a pre-compensation value, comprising the following steps of:

S01: marking masks of which parameters are same as first mask, second mask . . . Nth mask, wherein the masks are respectively corresponding to first lithographic layer, second lithographic layer . . . Nth lithographic layer during the lithograph; wherein, N is a positive integer;

S02: determining, in reference process conditions of the first mask, second mask . . . Nth mask, defocus amounts as $F_{1BSL}+/-F_{1BSLW}$ μm, $F_{2BSL}+/-F_{2BSLW}$ μm . . . $F_{NBSL}+/-F_{NBSLW}$ μm and exposure amounts as $E_{1BSL}+/-E_{1BSLW}$ mJ·cm$^{-2}$, $E_{2BSL}+/-E_{2BSLW}$ mJ·cm$^{-2}$ . . . $E_{NBSL}+/-E_{NBSLW}$ mJ·cm$^{-2}$, according to experimental values in a technology platform;

S03: making a focal distance-energy matrix for a first lithographic layer corresponding to the first mask, and determining the defocus amount as $F_{1EXP}$ μm and exposure amount as $E_{1EXP}$ mJ·cm$^{-2}$ in optimum process condition by a small batch of trial production;

S04: calculating a ratio M of the optimum process condition of the first mask deviating from the reference process condition, the ratio M being divided into a defocus amount ratio $M_1$ and an exposure amount ratio $M_2$, and judging whether the ratio $M_1$ or $M_2$ exceeds a set threshold, wherein if $M_1$ or $M_2$ is equal to or larger than the set threshold, the first mask is inspected, and after a correction is performed, the step S03 is repeated, and if both of M1 and M2 are less than the set threshold, a step S05 is started;

S05: according to the ratio and the reference process condition of the second mask, determining an optimum process condition of the second mask, $$F_{2EXP}=F_{2BSL}+F_{2BSLW}M_1 \text{ μm}, E_{2EXP}=E_{2BSL}+E_{2BSLW}\times M_2 \text{ mJ·cm}^{-2};$$

S06: by that analogy, according to the ratio M and the reference process condition of the Nth mask, determining an optimum process condition of the Nth mask, $$F_{NEXP}=F_{NBSL}+F_{NBSLW}\times M_1 \text{ μm}, E_{NEXP}=E_{NBSL}+E_{NBSLW}\times M_2 \text{ mJ·cm}^{-2}.$$

Preferably, the defocus amount ratio $M_1=(F_{1EXP}-F_{1BSL})/F_{1BSLW}$, and the value of M1 is within a range of 10% to 60%.

Preferably, the exposure amount ratio $M_2=(E_{1EXP}-E_{1BSL})/E_{1BSLW}$ and the value of $M_2$ is within a range of 8% to 60%.

Preferably, the masks of which parameters are same satisfy three conditions that the types are the same, the specifications are the same, and the substrates for fabricating the masks are the same batch.

Preferably, the type is one of a bipolar mask, a phase-shifting mask, an alternating phase shift mask.

Preferably, the specifications include measurement graph type, the maximum defects allowed in the linewidth, magnification of zoom in or zoom out, and roughness.

Preferably, the substrate for fabricating the mask is a substrate formed by depositing Cr or MoSi on a quartz substrate.

Preferably, in the step S03, a small batch of trial production may be performed for the first lithographic layer corresponding to the first mask, to determine the optimum process condition as $F_{1EXP}$ μm, exposure amount $E_{1EXP}$ mJ·cm$^{-2}$.

The beneficial effects of the present invention are as follows: the present invention uses the pre-compensation value to correct the optimum process condition of one batch mask with the same parameters, thus can obtain the optimum process condition of one batch mask with the same parameters by only making an exposure amount-defocus amount matrix one time.

Therefore, the present invention can quickly establishes the lithography process condition, effectively decreases the trial production time for determining the optimum defocus amount and exposure amount of the lithography process, the new products can be produced rapidly, and the production capability is improved, in addition, the quality of the inbound mask can be monitored by using a ratio of the optimum process condition of the first mask deviating from the optimum value of the reference process window, $(F_{1EXP}-F_1BSL)/F_{1BSLW}$ and $(E_{1EXP}-E_{1BSL})/E_{1BSLW}$.

BRIEF DESCRIPTION OF THE DRAWINGS

The optimization method and system for overlay error compensation of the present invention will be elucidated by reference to the following embodiments and the accompanying drawings, in which.

DETAILED DESCRIPTION OF THE EMBODIMENTS

Figure 1:
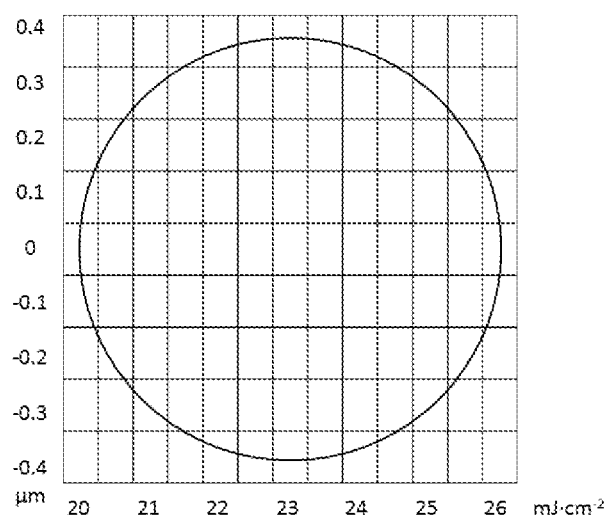
FIG. 1 is a schematic diagram of a method for determining an optimum lithograph process condition by using a focal distance-energy matrix.
Figure 2:
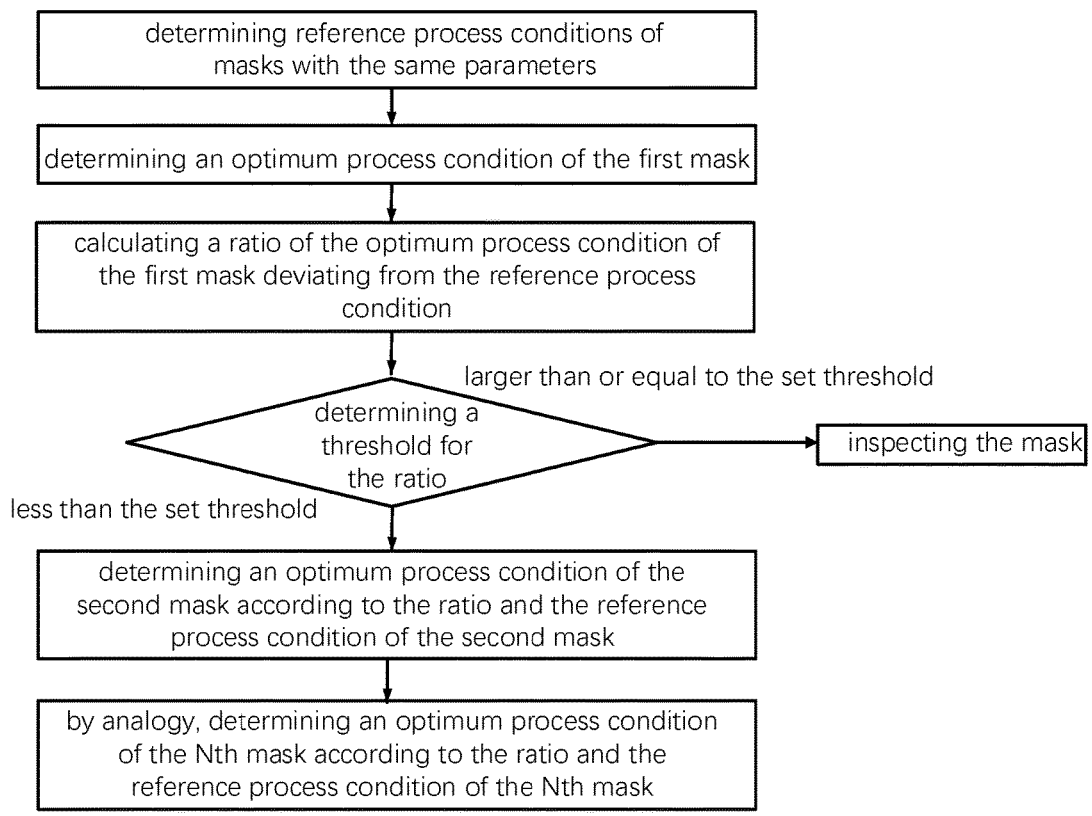
FIG. 2 is a flow chart of an embodiment of the present invention.

To make the object, the feature and the advantage of the present invention clearer, the specific embodiments of the present invention are described in detail below in combination with drawings.

Specifically, the method for quickly establishing lithography process condition by a pre-compensation value provided in the present invention comprises the following steps of:

S01: marking masks of which parameters are same as first mask, second mask . . . Nth mask, wherein the masks are respectively corresponding to first lithographic layer, second lithographic layer . . . Nth lithographic layer during the lithograph. Wherein, N is a positive integer.

In same embodiment of the present invention, the parameters being identical indicate that the first mask, second mask . . . Nth mask all satisfy three conditions that the types are the same, the specifications are the same, and the substrates for fabricating the masks are the same batch.

Wherein, the first mask, second mask . . . Nth mask may be one type of a bipolar mask, a phase-shifting mask or an alternating phase shift mask. The measurement graph type, the maximum defects allowed in the linewidth, magnification of zoom in or zoom out, and roughness are the same in the first mask, second mask . . . Nth mask.

In addition, the mask substrates for fabricating the first mask, second mask . . . Nth mask are the same batch, that is, the substrates for fabricating the masks are substrates formed by depositing Cr or MoSi with the same density and the same thickness on quartz substrates with the same specifications.

S02: determining, in reference process conditions of the first mask, second mask . . . Nth mask, defocus amounts as $F_{1BSL}+/-F_{1BSLW}$ μm, $F_{2BSL}+/-F_{2BSLW}$ nm . . . $F_{NBSL}+/-F_{NBSLW}$ μm, and exposure amounts as $E_{1BSL}+/-E_{1BSLW}$ mJ·cm$^{-2}$, $E_{2BSL}+/-E_{2BSLW}$ mJ·cm$^{-2}$ . . . $E_{NBSL}+/-E_{NBSLW}$ mJ·cm$^{-2}$, according to experimental values in a technology platform.

In this step, the defocus amount and the exposure amount in the reference process conditions are determined mainly by the previous lithograph process conditions stored in the technology platform, in other words, the reference process conditions of the different photomasks in the same batch are determined according to experimental values.

S03: making a focal distance-energy matrix for a first lithographic layer corresponding to the first mask and determining the defocus amount as $F_{1EXP}$ μm and exposure amount as $E_{1EXP}$ mJ·cm$^{-2}$ in the optimum process condition.

In this step, the focal distance-energy matrix indicates a test pattern in two-dimensional distribution of difference exposure energy and focal distance in one silicon wafer.

In other words, the different exposure amount setting is adopted in each of different regions in a horizontal/vertical direction, and the different defocus amount setting is adopted in each of different regions in a vertical/horizontal direction, so as to realize to adopt different exposure amount setting and/or different defocus amount setting in each region and to finally form the same image in each region by the lithography and measure the image formed in each region, thereby obtaining CD value of the image formed in different regions on the wafer and the whole data set of the corresponding exposure amounts and defocus amounts.

And the optimum defocus amount and exposure amount in the lithograph finally are determined according to the obtained optimum CD value of the image.

In addition, in this step, the optimum process condition of the first mask can also be determined by a small batch of trial production. That is, the lithograph can be performed by setting the different process conditions many times, and the pattern after the lithograph of each time is measured, thereby determining the optimum process condition according to CD values of the different patterns.

S04: calculating a ratio M of the optimum process condition of the first mask deviating from the reference process condition, the ratio M being divided into a defocus amount ratio M1 and an exposure amount ratio M2, and judging whether the ratio M exceeds a set threshold, wherein if M1 or M2 is equal to or larger than the set threshold, the first mask is inspected, and the step S03 is repeated after a correction is performed, and if both of M1 and M2 are less than the set threshold, a step S05 is started.

In the step S04, the defocus amount ratio $M1=(F_{1EXP}-F_{1BSL})/F_{1BSLW}$, and the value of M1 is within a range of 10% to 60%.

The exposure amount ratio $M2=(E_{1EXP}-E_{1BSL})/E_{1BSLW}$ and the value of M2 is within a range of 8% to 60%.

In the production process, the specific values of M1 and M2 are determined according to the experimental values stored in the technology platform.

S05: according to the ratio and the reference process condition of the second mask, determining an optimum process condition of the second mask, $F_{2EXP}=F_{2BSL}+F_{2BSLW}\times M1$ µm, $E_{2EXP}=E_{2BSL}+E_{2BSLW}\times M2$ mJ·cm$^{-2}$.

S06: by the analogy, according to the ratio M and the reference process condition of the Nth mask, determining an optimum process condition of the Nth mask, $F_{NEXP}=F_{NBSL}+F_{NBSLW}\times M1$ µm, $E_{NEXP}=E_{NBSL}+E_{NBSLW}\times M2$ mJ·cm$^{-2}$.

Since the parameters of the first mask, the second mask . . . the Nth mask are the same, the optimum process condition of the masks in one batch can corrected by using the pre-compensation value of the present invention, thus the optimum process condition of one batch masks with the same parameters can be obtained by only making an exposure amount-defocus amount matrix one time.

Therefore, the present invention can quickly establish the lithography process condition, effectively reduce the trial production time for determining the optimum defocus amount and exposure amount of the lithography process. And the new products can be produced rapidly, and the production capability is improved.

Embodiment 1

S01: marking masks of which parameters are same as first mask, second mask . . . Nth mask, wherein the masks are respectively corresponding to first lithographic layer, second lithographic layer . . . Nth lithographic layer during the lithograph.

S02: according to the experimental values in a technology platform, determining, in reference process conditions of the first mask, second mask . . . Nth mask.

The defocus amounts as $F_{1BSL}+/-F_{1BSLW}=0+/-100$ µm, $F_{2BSL}+/-F_{2BSLW}=0+/-120$ µm . . . $F_{NBSL}+/-F_{NBSLW}=0+/-110$ µm, the exposure amounts as $E_{1BSL}+/-E_{1BSLW}=23+/-2$ mJ·cm-2, $E_{2BSL}-/-E_{2BSLW}=23+/-2.5$ mJ·cm$^{-2}$ . . . $E_{NBSL}+/-E_{NBSLW}=23+/-3.0$ mJ·cm$^{-2}$.

S03: making a focal distance-energy matrix for a first lithographic layer corresponding to the first mask and determining the defocus amount as $F_{1EXP}=+10$ µm and exposure amount as $E_{1EXP}=23.5$ mJ·cm$^{-2}$ in the optimum process condition.

S04: calculating a ratio M of the optimum process condition of the first mask deviating from the reference process condition, the ratio M being divided into a defocus amount ratio M1 and an exposure amount ratio M2, $M1=(F_{1EXP}-F_{1BSL})/F_{1BSLW}=10\%$, $M2=(E_{1EXP}-E_{1BSL})/E_{1BSLW}=25\%$ and judging whether the ratio exceeds a set threshold, wherein the technology platform determines that a threshold for M1 is 30%, a threshold for M2 is 45%, and it can be seen that M1<30%, M2<45%.

S05: according to the ratio and the reference process condition of the second mask, determining an optimum process condition of the second mask, $F_{2EXP}=F_{2BSL}+F_{2BSLW}\times M1=12$ µm, $E_{2EXP}=E_{2BSL}+E_{2BSLW}\times M2=23.6$ mJ·cm$^{-2}$.

S06: by that analogy, according to the ratio M and the reference process condition of the Nth mask, determining an optimum process condition of the Nth mask, $F_{NEXP}=F_{NBSL}+F_{NBSLW}\cdot M1=11$ µm, $E_{NEXP}=E_{NBSL}+E_{NBSLW}\times M2=23.8$ mJ·cm$^{-2}$.

The above is only the preferred embodiment of the present invention. Said embodiment is not intended to limit the patent protection scope of the present invention. Therefore, all the equivalent structural changes made using the contents of the specification and drawings of the present invention, should be encompassed in the protection scope of the present invention in a similar way.

The invention claimed is:

1. A method for establishing lithography process condition by a pre-compensation value, wherein, comprising the following steps of:

S01: marking masks with same parameters as a first mask, a second mask . . . an Nth mask, which are respectively corresponding to a first lithographic layer, a second lithographic layer . . . an Nth lithographic layer during a lithograph; wherein, N is a positive integer;

S02: determining, in reference process conditions of the first mask, second mask . . . Nth mask, defocus amounts as $F_{1BSL}+/-F_{1BSLW}$ µm, $F_{2BSL}+/-F_{2BSLW}$ µm . . . $F_{NBSL}+/-F_{NBSLW}$ µm, according to experimental values of parameters of the lithography process conditions which are stored in a technology platform; and exposure amounts as $E_{1BSL}+/-E_{1BSLW}$ mJ·cm$^{-2}$, $E_{2BSL}+/-E_{2BSLW}$ mJ·cm$^{-2}$ . . . $E_{NBSL}+/-E_{NBSLW}$ mJ·cm$^{-2}$, according to experimental values in a technology platform;

S03: making a focal distance-energy matrix for a first lithographic layer corresponding to the first mask and determining the defocus amount as $F_{1EXP}$ µm and exposure amount as $E_{1EXP}$ mJ·cm$^{-2}$ in an optimum process condition;

S04: calculating a ratio M of the optimum process condition of the first mask deviating from the reference process condition, the ratio M comprises a defocus amount ratio M1 and an exposure amount ratio M2, and judging whether the defocus amount ratio M1 or the exposure amount ratio M2 exceeds a set threshold, wherein if M1 or M2 is equal to or larger than the set threshold, the first mask is inspected, and the step S03 is repeated after a correction is performed, and if both of M1 and M2 are less than the set threshold, a step S05 is started; S05: according to the ratio and the reference process condition of the second mask, determining an optimum process condition of the second mask, $F_{2EXP}=F_{2BSL}+F_{2BSLW}\times M1$ µm, $E_{2EXP}=E_{2BSL}+E_{2BSLW}M2$ mJ·cm$^{-2}$; S06: by analogy, according to the ratio M and the reference process condition of the Nth mask, determining an optimum process condition of the Nth mask, $F_{NEXP}=F_{NBSL}+F_{NBSLW}M1$ µm, $E_{NEXP}=E_{NBSL}+E_{NBSLW}\times M2$ mJ·cm$^{-2}$; wherein in the step S03, a small batch of trial production is performed on the first lithographic layer corresponding to the first mask, to determine the optimum process condition as $F_{1EXP}$ µm, exposure amount $E_{1EXP}$ mJ cm$^{-2}$, the small batch of trial production comprises performing lithographic processes for multiple times under different process conditions, and measuring patterns after each lithographic process, thereby determining the optimum process condition according to CD values of the different patterns.

2. The method for establishing lithography process condition by a pre-compensation value according to claim 1, wherein the defocus amount ratio $M1=(F_{1EXP}-F_{1BSL})/F_{1BSLW}$, and the value of M1 is within a range of 10% to 60%.

3. The method for establishing lithography process condition by a pre-compensation value according to claim 1, wherein the exposure amount ratio $M2=(E_{1EXP}-E_{1BSL})/E_{1BSLW}$ and the value of M2 is within a range of 8% to 60%.

4. The method for quickly establishing lithography process condition by a pre-compensation value according to claim 1, wherein the parameters of the masks are same in the following ways: the types of the masks are the same, the specifications are the same, and the substrates for fabricating the masks are the same batch; wherein the type of the mask is a bipolar mask, a phase-shifting mask, or an alternating phase shift mask; the specification includes a measurement pattern type, a maximum defect allowed in linewidth, a magnification of zoom in or zoom out, and a roughness.

5. The method for establishing lithography process condition by a pre-compensation value according to claim 4, wherein the substrate for fabricating the mask is a substrate formed by depositing Cr or MoSi on a quartz substrate.

\* \* \* \* \*